(12) United States Patent
Esmark et al.

(10) Patent No.: US 7,202,527 B2
(45) Date of Patent: Apr. 10, 2007

(54) MOS TRANSISTOR AND ESD PROTECTIVE DEVICE EACH HAVING A SETTABLE VOLTAGE RATIO OF THE LATERAL BREAKDOWN VOLTAGE TO THE VERTICAL BREAKDOWN VOLTAGE

(75) Inventors: Kai Esmark, München (DE); Harald Gossner, Riemerling (DE); Gunther Mackh, Tegernheim (DE); Richard Owen, Regensburg (DE); Franz Zängl, München (DE)

(73) Assignee: Infineon Technologies AG, München (DE)

( * ) Notice: Subject to any disclaimer, the term of this patent is extended or adjusted under 35 U.S.C. 154(b) by 42 days.

(21) Appl. No.: 10/903,027

(22) Filed: Jul. 29, 2004

(65) Prior Publication Data

US 2005/0001270 A1    Jan. 6, 2005

Related U.S. Application Data

(62) Division of application No. 10/263,097, filed on Oct. 2, 2002, now Pat. No. 6,884,688.

(30) Foreign Application Priority Data

Oct. 2, 2001    (DE)    ................................ 101 48 794

(51) Int. Cl.
  H01L 29/76    (2006.01)
  H01L 29/94    (2006.01)
  H01L 31/062   (2006.01)
  H01L 31/113   (2006.01)
  H01L 31/119   (2006.01)

(52) U.S. Cl. .................. 257/336; 257/344; 257/549; 257/550; 257/408

(58) Field of Classification Search ................ 257/338, 257/339, 355–357, 344, 408, 549–550, 336
See application file for complete search history.

(56) References Cited

U.S. PATENT DOCUMENTS

| 5,301,084 | A  | * | 4/1994  | Miller ........................ 361/56   |
| 5,532,508 | A  | * | 7/1996  | Kaneko et al. ............. 257/336      |
| 5,719,424 | A  |   | 2/1998  | Ahmad et al.                             |
| 6,017,798 | A  |   | 1/2000  | Ilderem et al.                           |
| 6,074,906 | A  |   | 6/2000  | Cheek et al.                             |
| 6,096,616 | A  |   | 8/2000  | Nistler et al.                           |
| 6,211,023 | B1 |   | 4/2001  | Yeh et al.                               |
| 6,238,960 | B1 |   | 5/2001  | Maszara et al.                           |
| 6,297,114 | B1 |   | 10/2001 | Iwata et al.                             |
| 6,383,883 | B1 |   | 5/2002  | Cheng et al.                             |
| 6,391,733 | B1 |   | 5/2002  | Fisher                                   |
| 6,528,376 | B1 |   | 3/2003  | Guo                                      |

FOREIGN PATENT DOCUMENTS

DE    199 44 488 A1    4/2001

OTHER PUBLICATIONS

Warren R. Anderson et al.: „ESD Protection for Mixed-Voltage I/O Using NMOS Transistors Stacked in a Cascade Configuration, *Proceedings of the EOS/ESD Symposium 1998*, pp. 54-63.

* cited by examiner

*Primary Examiner*—M. Wilczewski
*Assistant Examiner*—Monica Lewis
(74) *Attorney, Agent, or Firm*—Laurence A. Greenberg; Werner H. Stemer; Ralph E. Locher

(57) ABSTRACT

A MOS transistor includes a drain zone, a source zone, and a gate electrode. Doping atoms of the first conductivity type are implanted in the region of the drain zone and the source zone by at least two further implantation steps such that a pn junction between the drain zone and a substrate region is vertically shifted and a voltage ratio of the MOS transistor between a lateral breakdown voltage and a vertical breakdown voltage can be set.

10 Claims, 2 Drawing Sheets

MOS TRANSISTOR AND ESD PROTECTIVE DEVICE EACH HAVING A SETTABLE VOLTAGE RATIO OF THE LATERAL BREAKDOWN VOLTAGE TO THE VERTICAL BREAKDOWN VOLTAGE

CROSS-REFERENCE TO RELATED APPLICATIONS

This divisional application claims the benefit under 35 U.S.C. §120 of U.S. application Ser. No. 10/263,097, filed Oct. 2, 2002 now U.S. Pat. No. 6,884,688. This application also claims the priority, under 35 U.S.C. §119, of German patent application No. 101 48 794.0, filed Oct. 2, 2001. The prior applications are herewith incorporated by reference in their entirety.

BACKGROUND OF THE INVENTION

FIELD OF THE INVENTION

The invention relates to a MOS transistor and a method of producing a MOS transistor.

Furthermore, the invention relates to a method of producing a CMOS structure with an ESD protective device and an ESD protective device for signal inputs and outputs with overvoltage tolerances, in particular in the case of CMOS circuits wherein an ESD protective element is configured as a MOS transistor which is electrically connected to an I/O pad of the CMOS circuit.

On account of the progress in semiconductor technology, the integrity of integrated circuits (ICs) is becoming increasingly greater and integrated circuits are reaching degrees of integration of ULSI (Ultra Large Scale Integration) or higher. The capacity of an individual semiconductor chip is increasing from several 1000 components up to 100,000 components or even up to millions of components. If, for example, a DRAM (Dynamic Random Access Memory) component is considered, the capacity of an individual chip of previously 4 megabits is being increased to up to 256 megabits or even more on account of the increasing downscaling of the component. This shows that components in integrated circuits, such as transistors or capacitors for example, must be adapted with regard to their component size and their capacity to the corresponding areas of use wherein these components are used. The enormously increasing packing density of integrated circuits therefore brings with it a large number of challenges for the processes of semiconductor technology to meet. At the same time, it must be ensured when producing a component with reduced dimensions that the characteristics and mode of operation of the entire integrated circuit is not influenced. The requirements for high packing densities, low heat generation and low energy consumption of the components on the one hand and great reliability and long service life on the other hand must be taken into account in the production of the component and must not lead to any loss in quality of the functions of the component during the production of the component. At the same time, it is expected that these objectives can be achieved by a simultaneous development and improvement in photolithography, etching, depositing, ion implantation and the thermal processes in semiconductor technology.

The down-scaling of the components is also accompanied by a decrease in the thickness of the gate oxide region in the MOS components. This reduction of the gate oxide region with respect to the breakdown voltage especially makes signal inputs/outputs of the semiconductor components which are connected to external circuits or components much more susceptible to damage caused by high voltages, such as can occur for example in the case of electrostatic discharges (ESD: Electrostatic Discharge). A breakdown in the gate oxide region or damage caused by excess heating-up of a component is produced on account of a high voltage gradient which occurs when there is an ESD event. The high voltage gradient in this case causes an injection of electrons in the gate oxide region and an acceleration of charge carriers in the channel region. As a result, the characteristics and operation of the component are significantly influenced. Currents of several amperes, which can occur during an ESD event and are present at pin terminals of an integrated circuit, can lead to permanent damage to or destruction of the component. In order to protect the signal inputs/outputs of the CMOS components from damage caused by such an ESD event, in such CMOS circuits a higher dielectric strength must be ensured in the signal input/output (I/O) region than in their core region. Since the gate oxide region of MOS transistors is damaged by voltages higher than the nominal voltage, it is mostly the voltage which, taking into consideration the service lives specified for them, is allowed to occur as a maximum over the gate oxide region of the MOS transistors used that generally has a limiting effect.

Proposed solutions in the prior art for the above problem of higher dielectric strength in the I/O region of CMOS circuits use a series connection of NMOS transistors (W. Anderson, D. Krakauer: EOS/ESD Symp. Proc., 1998, pages 54–62), which are designed as ESD protective elements. However, a series connection of this type often reduces the ESD performance with regard to the ESD strength of the corresponding ESD protective element and the voltage limitation in the high current range, so that there is a reduced protective effect.

In the case of a further ESD protective configuration—see German patent application DE 199 44 488 A1—an NMOS transistor with a high threshold voltage, which may be about 2 V, is used as a central ESD protective element. The gate of the NMOS transistor is subjected to an increased voltage of, for example, 1 V. At this level, no relevant leakage current occurs as yet. However, this bias at the gate has the effect of correspondingly reducing the voltage drop across the gate oxide region to the drain side of the NMOS transistor. The increasing of the threshold voltage of the NMOS transistor can in this case be achieved by suitable doping of its lightly doped LDD regions, wherein for example the $n^+$-conducting source zone and the $n^+$-conducting drain zone are provided in their respective region adjoining the channel, beneath the gate electrode, with a pldd implantation instead of an nldd implantation.

In the case of all the prior art protective devices, the ESD protective element integrated as standard into I/O pads is chosen such that, in the case of an ESD event, the excess charge accumulated, with it being possible for the resultant discharge current to be several amperes and the typical duration of a discharge to be approximately between 100 and 200 ns, is drained off with low impedance to one of the supply lines. This ensures that the remaining part of the circuit together with the core region is protected against electrical overvoltages and thermal overload. The individual elements of an ESD protective device are at the same time designed to match in such a way that they provide the CMOS circuit with a required ESD strength without running the risk of also being destroyed themselves. On account of its electrical properties, the MOS transistor is one of the most important ESD protective elements of the known devices. Under high current conditions, in the case of this element a parasitic bipolar transistor is activated, which clamps a voltage present at one of its outer nodes to a value that is uncritical for the remaining part of the circuit. Within the component, the activation of the parasitic bipolar transistor means the electrical breakdown of the drain zone into a substrate region in the transitional region beneath the gate electrode. This breakdown is referred to as a lateral breakdown. In the prior art ESD protective devices, only improvements with regard to this lateral breakdown are carried out.

The combination of electric field strength and current density in the case of the lateral breakdown then leads to great energy dissipation and crystal heating in this region of the breakdown. At the same time, however, the current flow in the region of the drain zone causes a voltage drop along this drain zone, which may become so great that the MOS transistor also breaks down in the transitional region between the drain zone and the substrate outside the gate zone. This breakdown is referred to as a vertical breakdown.

SUMMARY OF THE INVENTION

It is accordingly an object of the invention to provide a MOS transistor and a method of fabricating a MOS transistor, which overcomes the above-mentioned disadvantages of the heretofore-known devices and methods of this general type and which achieves high functional robustness of the device in high current operation. It is a further object to provide a method of producing the CMOS structure with an ESD protective device and of providing an ESD protective device for signal inputs and outputs with overvoltage tolerances, in particular in the case of CMOS circuits, wherein the transistor devices and the method render it possible to achieve improved protection against damage or destruction caused by an ESD event.

With the foregoing and other objects in view there is provided, in accordance with the invention, a method of producing a MOS transistor, which comprises the following steps:

forming a source zone and a drain zone each with a highly doped region of a first conductivity type in a substrate region of a second conductivity type, opposite to the first conductivity type;

subsequently to forming the highly doped region of the drain zone and the highly doped region of the source zone, implanting doping atoms of the first conductivity in the region of the drain zone and the source zone such that a local position of a pn junction between the drain zone and the substrate is vertically shifted; and forming a gate oxide region and a gate electrode above a channel region between the drain zone and the source zone.

In other words, the MOS transistor is produced with a drain zone and a source zone of a first conductivity type in a substrate region of a second conductivity type. The second conductivity type is opposite the first conductivity type. Above a channel region between the drain zone and the source zone, a gate electrode with a gate oxide region is produced.

According to the invention, after the forming of the highly doped region of the drain zone and the highly doped region of the source zone, doping atoms of the first conductivity type are implanted in the region of the drain zone and the source zone in such a way that a local position of the pn junction between the drain zone and the substrate is vertically shifted.

This allows the functional robustness of the MOS transistor in high current operation to be improved.

In accordance with an added feature of the invention, the implantation is carried out in at least two implanting steps. The implanting may be carried out after the forming of LDD regions. It is possible to to implant the doping atoms near the surface with a high doping concentration in one implantation step. In a further implantation step, the implanting may be carried out in such a way that a retrograde doping profile is respectively formed in the drain zone and the source zone, with a lower concentration of doping atoms and a greater depth in comparison with the first implantation step. It is advantageous that the local position of the pn junction between the drain zone and the substrate region is shifted in such a way that a voltage ratio between a value of a lateral breakdown voltage and a value of a vertical breakdown voltage is reduced. The doping profiles are formed in dependence on the energy and/or dosage of the implanted doping atoms and/or the type of doping atoms.

This can achieve the effect that the position of the pn junction can be set relatively accurately.

The fact that the at least two implantation steps are carried out with a mask has the effect on the one hand of reducing the expenditure for producing the MOS transistor. On the other hand, the process steps are self-adjusted in relation to the gate of the MOS transistor. A further advantage is that the two implantation steps do not cause the electrical properties of other components on a chip to be influenced or altered.

The fact that both the lateral breakdown voltage and the vertical breakdown voltage are changed allows a more accurate and finer setting to be achieved with respect to the requirements imposed on the MOS transistor in the case of high current.

In the case of a method of producing an ESD protective device, an ESD protective element is formed in a way corresponding to the MOS transistor according to the invention and the drain zone is, for example, connected to an I/O pad. A first region of the second conductivity type is processed into the substrate and electrically connected to an ground terminal. It may also be provided that the drain zone is at a supply voltage $U_{DD}$, the gate is at ground and the source region is electrically connected to the I/O pad or is connected to ground.

This can achieve the effect that the thermal loading of the ESD protective device is reduced. Consequently, a higher ESD strength is achieved and the probability of destruction of or damage to a circuit, in particular a CMOS circuit, being caused by an ESD event is lowered.

A further aspect of the invention concerns a MOS transistor which has a drain zone and a source zone of a first conductivity type and a gate electrode with a gate oxide region which is arranged in the channel region between the drain zone and the source zone.

According to the invention, the voltage ratio of the transistor between a value of a lateral breakdown voltage and a value of a vertical breakdown voltage can be set.

This allows improved functional robustness to be achieved in high current operation with a relatively simple structure of the MOS transistor.

The voltage ratio can advantageously be set by the variation in the dopant concentration.

In the case of a preferred exemplary embodiment, the variation in the dopant concentration is set in such a way that the MOS transistor has a first highly doped zone of the first conductivity type, which is arranged between the gate oxide region and a first LDD region, and a second highly doped zone of the first conductivity type, which is arranged between the gate oxide region and a second LDD region. A third zone of the first conductivity type is arranged between the source zone and the substrate region in the form of a well around the source zone. A fourth zone of the first conductivity type is arranged between the drain zone and the substrate region in the form of a well around the drain zone. The high doping of the first and second zones is relative in comparison to the LDD regions.

With the above and other objects in view there is also provided, in accordance with the invention, a circuit, in particular a CMOS circuit, with an ESD protective device for signal inputs and outputs with overvoltage tolerances. The ESD protective device has in this case a MOS transistor according to the invention, which is configured as an ESD protective element. This MOS transistor is, for example, electrically connected to an I/O pad of the circuit.

This can achieve the effect that the thermal loading of the circuit is reduced. Consequently, the circuit has a greater ESD strength and the probability of the circuit being destroyed or damaged on account of an ESD event is lowered.

Further advantages of the MOS transistor according to the invention and of the ESD protective device according to the invention and also of the method can be seen in the fact that the MOS transistor structure and also the ESD protective device do not necessitate a enlargement of the surface area required for laying out the transistor configured as an ESD protective element.

Other features which are considered as characteristic for the invention are set forth in the appended claims.

Although the invention is illustrated and described herein as embodied in a method for producing a MOS transistor and a MOS transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
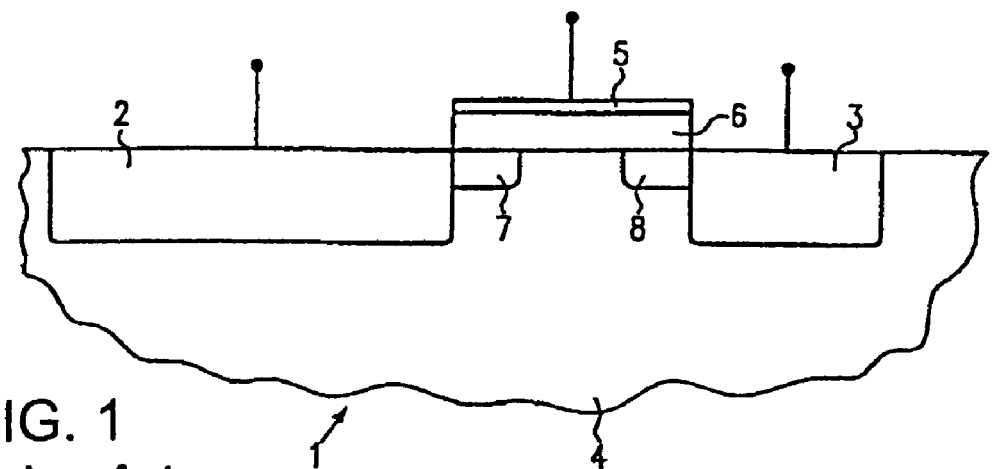
FIG. 1 is a partial sectional side view of a prior art transistor with LDD regions.

Referring now to the figures of the drawing in detail and first, particularly, to FIG. 1 thereof, there is shown a structure of a prior art MOS transistor 1 with a drain zone 2 and a source zone 3 of a first conductivity type in a substrate 4 of a second conductivity type. Furthermore, the MOS transistor 1 has a gate electrode 5 and a gate oxide region 6, which is arranged between the drain zone 2 and the source zone 3. In the substrate region 4 and beneath the gate oxide region 6, the MOS transistor 1 has a first LDD (Lightly Doped Drain) region 7 and a second LDD region 8. These two LDD regions 7 and 8 have the same conductivity type as the drain zone 2 and the source zone 3. Degradation effects which are caused by an abrupt transition between the drain zone 2 and the substrate 4 are lessened on account of these LDD regions 7 and 8. One degradation effect is the "hot electron degradation" effect. In this case, gate oxides degrade in the gate oxide region 6 under the influence of electrons which are injected into the oxide or tunnel through the oxide.

Therefore, a field strength peak occurs during operation of a MOS transistor at a channel edge on the drain side and can accelerate channel electrons up to almost their limit velocity. These "hot electrons" can overcome the potential barrier at the interface between the gate oxide region 6 and the substrate 4.

In the case of the n-channel-MOS (NMOS) transistor, these "hot electron degradation" effects are manifested in particular by a degradation of the drain current, because both the number and the mobility of the channel electrons are reduced by the effects described above. LDD doping is generally used as an effective countermeasure for this. The smoother transition of the drain doping achieved as a result brings about a lowering of the field strength peak which triggers the hot electrons. A reliable overlap of the gate electrode 5 over the LDD regions 7 and 8 is essential for the effectiveness of the LDD doping.

In the case of the p-channel-MOS (PMOS) transistor, negative fixed interface charges at the channel edge on the drain side induce a hole inversion layer on the surface of the substrate 4. This inversion layer means that the channel length is shortened. The accompanying lowering of the turn-on voltage leads to increased drain currents. Under certain circumstances, the p-channel transistor consequently no longer turns off adequately at 0 V. This can be prevented by the LDD regions 7 and 8.

However, in the case of a transistor which is electrically connected to non-illustrated signal inputs and outputs, known as an I/O pad, the formation of the lightly doped LDD regions 7 and 8 leads to a reduction in the functional robustness in the high current case of the transistor. Consequently, the risk of damage to or destruction of the component or an entire circuit configuration, for example a CMOS circuit, is relatively great.

Figure 2:
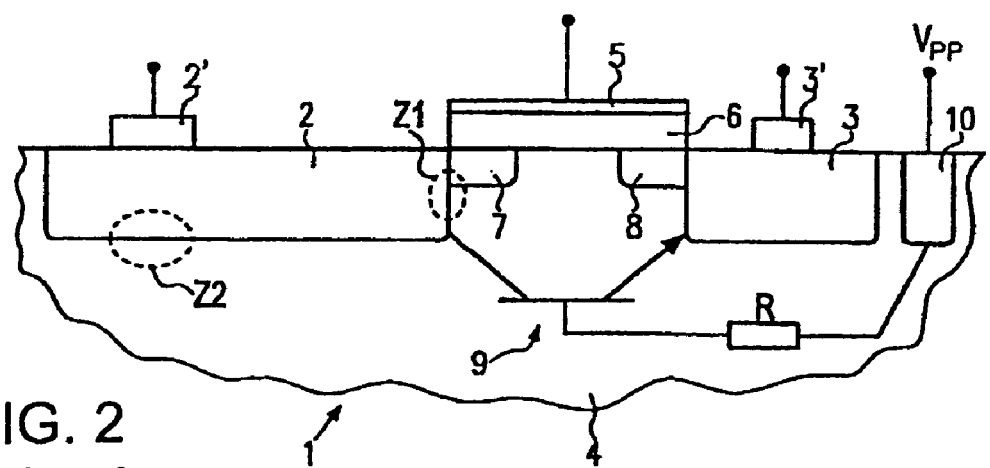
FIG. 2 is a similar view of a MOS transistor with an activated bipolar transistor and regions of a lateral breakdown and a vertical breakdown.

In FIG. 2, a MOS transistor 1 known from the prior art is represented in the case of a high current event. Functionally identical elements have been taken over from FIG. 1 with the same reference numerals. The drain zone has a contact region 2' and the source zone has a contact region 3'.

If a high current event causes a high voltage to be generated between the ground terminal $V_{pp}$ and the terminal at the drain zone 2, the MOS transistor 1 breaks down in the zone Z1 between the drain zone 2 and the substrate region 4. This breakdown is referred to as a lateral breakdown of the transistor 1. In the case of lateral breakdown, the drain zone 2, the source zone 3 and the substrate 4 function as a bipolar transistor 9. The base of the bipolar transistor 9 lies in the substrate 4, the collector lies against the drain zone 2 and the emitter against the source zone 3. The base of the bipolar transistor 9 is connected via a resistor R to a terminal zone 10 in the substrate 4 to the ground terminal $V_{pp}$. As a result, the high voltage generated between the collector and the emitter when there is a lateral breakdown is clamped to a voltage value which is uncritical for the remainder of the circuit. During the lateral breakdown, electrons are driven into the collector region or the drain zone 2. The holes injected into the base or into the substrate cause an increase in the voltage in the substrate 4 and consequently a positive bias of the emitter junction, and consequently a turning-on of the bipolar transistor 9. As a consequence of this, an injection of electrons from the emitter or the source zone 3 into the substrate 4 is increased, those electrons which reach the collector-base junction generating new electron/hole pairs and thereby further increasing the current follow. On account of this effect, the current flow between the emitter and the collector is constantly increased. The high current flow in the region of the collector or the drain zone 2 along the width of the drain zone 2 causes a voltage drop which is so great that the transistor 1 also breaks down vertically beneath the contact terminal 2'. The term vertical breakdown of the transistor 1 refers to the breakdown between the drain zone 2 and the substrate 4 in the zone Z2. In this case, on the one hand a zone resistance of a charge carrier diffusion in the drain zone 2 fixes the voltage drop over the charge carrier diffusion, on the other hand the local lateral breakdown voltage determines at which current density in the drain zone 2 the vertical breakdown occurs.

Since the value of the lateral breakdown voltage is virtually equal to the value of the vertical breakdown voltage, a breakdown occurs at the zones Z1 and Z2 at virtually the same voltages. While on the one hand damage to or destruction of the component is prevented by the lateral breakdown and the accompanying activation of the bipolar transistor 9, on the other hand damage to or destruction of the component is caused by the virtually simultaneous vertical breakdown in the region of the zone Z2. The ratio of the lateral breakdown voltage to the vertical breakdown voltage is virtually fixed in the MOS transistor 1 in FIG. 2 and cannot be changed. Therefore, the MOS transistor 1 has a relatively low strength with respect to high current events occurring.

Figure 3:
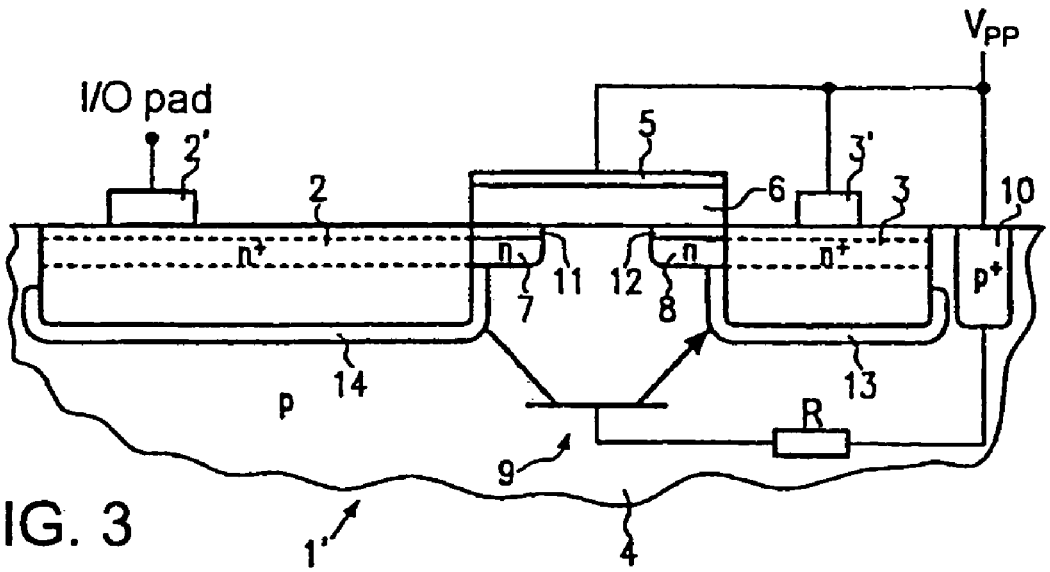
FIG. 3 is a section taken through an exemplary embodiment of an ESD protective device according to the invention, with an NMOS transistor configured as an ESD protective element.

In FIG. 3, a MOS transistor according to the invention is configured as an ESD protective element in an ESD protective device. The transistor is in this case configured as a ggNMOS (grounded gate NMOS) transistor 1'. The gate electrode 5 is connected to the ground terminal $V_{pp}$ and the contact terminal 2' of the drain zone 2 is connected to an I/O pad. As also in FIGS. 1 and 2, the width of the drain zone 2 is made greater than the width of the source zone 3. Similarly to the LDD regions 7 and 8, the drain zone 2 and the source zone 3 are made n-conducting and the substrate 4 and the terminal region 10 are made p-conducting. The NMOS transistor 1' has a first highly doped n zone 11 between the gate oxide region 6 and the LDD region 8. A second highly doped n zone 12 is arranged between the gate oxide region 6 and the second LDD region 7. A third zone 13 is arranged between the source zone 3 and the substrate region 4 and surrounds the source zone 3 in the form of a well. A fourth zone 14 is arranged between the drain zone 2 and the substrate region 4 and surrounds the drain zone 2 in the form of a well. Both the third zone and the fourth zone are in this case made n-conducting.

After the forming of the highly doped $n^+$ drain zone 2, the $n^+$ source zone 3, which, by way of example, have doping concentrations of the order of $10^{21}$, and the lightly n-doped LDD regions 7 and 8, the four zones 11, 12, 13, 14 are produced. In a first implantation step, the first zone 11 and the second zone 12 are formed, in that in the exemplary embodiment doping atoms of the n conductivity type are implanted near the surface with a high doping concentration. The zone 11 and the zone 12 are formed with a relatively low depth in comparison with the LDD regions 7 and 8. In a second implantation step, the third zone 13 and the fourth zone 14 are formed. In the second implantation step, in the exemplary embodiment doping atoms of the n conductivity type are implanted in such a way that a retrograde doping profile is respectively formed in the drain zone 2 and the source zone 3, with a lower concentration of the doping atoms and a greater vertical depth in comparison with the doping profiles produced in the first implantation step. The first zone 11 and the second zone 12 have, for example, doping concentrations of the order of approximately $10^{20}$. A third zone 13 and the fourth zone 14 have, for example, doping concentrations of the order of approximately $10^{19}$.

The forming of the zones 11, 12, 13 and 14 can also be carried out by more than two implantation steps.

The doping profiles of the four zones 11, 12, 13, 14 are formed in dependence on the energy and/or the dosage of the implanted doping atoms in such a way that a pn junction between the drain zone 2 and the substrate region 4 is shifted in the direction of the surface of the drain zone 2. The voltage ratio between the lateral breakdown voltage and the vertical breakdown voltage is reduced in dependence on the doping profiles formed. The value of the lateral breakdown voltage is in this case reduced and the value of the vertical breakdown voltage is increased. Phosphorus atoms are implanted as doping atoms both for the first implantation step and for the second implantation step. The doping profiles may also be changed by the type of doping atoms. It may therefore also be provided to implant arsenic atoms for an n-conducting doping in the first step and to implant phosphorus atoms in the second implantation step, or vice versa.

Figure 4:
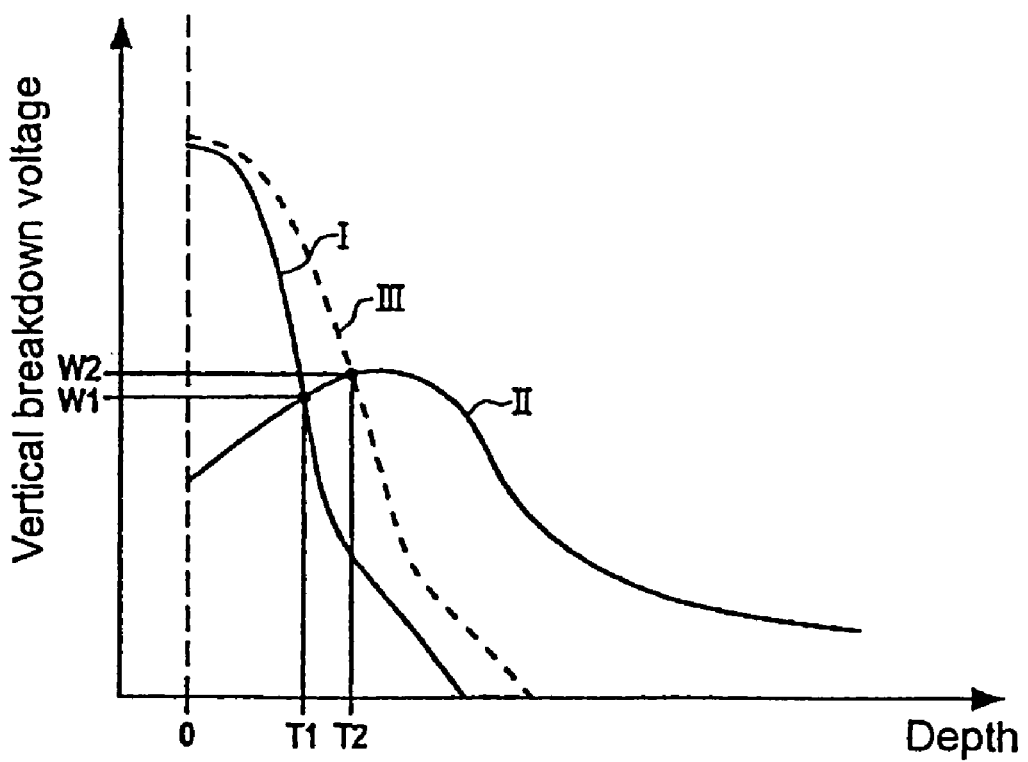
FIG. 4 is a graph with a doping profile plotted against the depth in a vertical section through a drain zone.

A variation of the doping profiles is schematically reproduced in FIG. 4. In the diagram, the vertical breakdown voltage is plotted against the depth in a vertical section through the drain zone 2. The zero point of the depth is set at the surface of the drain zone 2. The curve I in this case shows the doping profile variation of the n-conducting doping atoms which are implanted by the first and second implantation steps. The curve II shows the doping profile variation of the p-conducting doping atoms, for example boron atoms, of the substrate. At the point of intersection of the curves I and II, the pn junction is at a depth T1. The pn junction is understood as the location at which the sum of the doping concentrations of the n-conducting and p-conducting doping atoms pass through a change of sign. This point of intersection of the curves I and II corresponds to a first vertical breakdown voltage value W1. By keeping the curve variation II constant and shifting the profile variation of the n-conducting doping atoms according to curve III by the implantation steps, a new point of intersection occurs between the curve II and the curve III. This means that the pn junction is shifted to the depth T2. This results in a new vertical breakdown voltage W2. In the diagram, only the change in the vertical breakdown voltage value is plotted. The change in the vertical breakdown voltage value is accompanied by a change in the lateral breakdown voltage value.

It is important for the invention that the point of intersection between the n-conducting and p-conducting doping profile variations are set by changing the n-conducting doping profile variation such that the vertical breakdown voltage value is changed, and in particular the voltage ratio between the lateral breakdown voltage value and the vertical breakdown voltage value is reduced. In FIG. 4, a profile variation in an NMOS transistor is represented. This can similarly also be represented for a PMOS transistor.

Both the depths and the widths of the four zones 11, 12, 13, 14 (FIG. 3) may be variably formed in dependence on the requirements which are imposed on the MOS transistor 1', in order to permit appropriate protection against high current conditions in the application respectively required. The doping atoms may in this case be implanted with high, moderate or low energy and high, moderate or low dosage.

In the exemplary embodiment, four zones 11, 12, 13, 14 are arranged according to the representation in FIG. 3. How and how many zones of this type are arranged in the region of the drain zone and the source zone is not essential for the invention. It may also be envisaged for example not to form the zones 11 and 12 near the surface or not to form the zones 13 and 14 in the form of wells. However, it is important that the zones are formed in such a way that a desired voltage ratio between the lateral breakdown voltage and the vertical breakdown voltage of the transistor can be set.

In the exemplary embodiment, the doping profiles are configured in such a way that the value of the lateral breakdown voltage is lowered and at the same time the value of the vertical breakdown voltage is raised. However, a reduction in the voltage ratio of the lateral breakdown voltage to the vertical breakdown voltage can also be achieved in different ways. The changing of the voltage ratio chosen in the exemplary embodiment has the effect in the case of an ESD event that the lateral breakdown is achieved at a lower breakdown voltage, which lies below the breakdown voltage of the gate oxide region 6. This means that the parasitic bipolar transistor 9 is already activated at a lower lateral breakdown voltage. At the same time, it is also achieved that the probability of the vertical breakdown is lessened by increasing the value of the vertical breakdown voltage. Consequently, the ratio of the lateral breakdown voltage to the vertical breakdown voltage can be varied by the variable forming of the doping profiles, and consequently an ESD strength necessary for the CMOS circuit with regard to required operating conditions of the CMOS circuit can be achieved. The thermal loading of the CMOS circuit can at the same time be reduced by changing the ratio of the lateral breakdown voltage to the vertical breakdown voltage.

The voltage ratio can, however, also be set in such a way that it is increased, that is to say the value of the lateral breakdown voltage is raised and the value of the vertical breakdown voltage is lowered. This may be desired in the case of MOS transistors which are not used as ESD protective elements.

The processing of the implantation steps is referred to as input/output LDD (I/O LDD) and is carried out as a special doping process for that transistor 1, 1' configured as an ESD protective element which is electrically connected to signal inputs and outputs. As a result, in the exemplary embodiment a weakening of an abrupt doping profile transition between the drain zone 2, the source zone 3 and the substrate 4 is reduced by the formed LDD regions 7 and 8 and reconfigured in the direction of an abrupt doping profile transition. Therefore, a relatively abrupt doping profile transition is produced particularly in the region near the gate oxide region 6, and as a result the probability of a breakdown is lessened.

The forming of n-conducting regions is not restricted to the doping atoms phosphorus and/or arsenic but can also be produced by implanting other n-conducting dopants. Similarly, the forming of p-conducting regions is not restricted to the doping atoms boron.

The MOS transistor and the ESD protective device and also the method of producing the MOS transistor and the CMOS structure can be used both for NMOS transistors and for PMOS transistors. Both the protective device and the method can also be used for other components, for example thyristors, which are used on the basis of NMOS or PMOS transistors. Furthermore, the method can also be used in BiCMOS (Bipolar Complementary Metal Oxide Semiconductor) technologies with underlaid n-bit lines.

We claim:

1. A MOS transistor, comprising:
   a substrate;
   a drain zone of a first conductivity type formed in said substrate;
   a source zone of the first conductivity type formed in said substrate, and a channel region formed between said drain zone and said source zone;
   a gate electrode and a gate oxide region disposed above said channel region;
   said gate electrode, said drain zone, and said source zone together forming a transistor structure with a lateral breakdown voltage and a vertical breakdown voltage, and said transistor structure having an adjustable voltage ratio between a value of the lateral breakdown voltage and a value of the vertical breakdown voltage, the adjustable voltage ratio being dependent on a variation in a dopant concentration in said drain zone and said source zone, the variation in the dopant concentration being adjustable such that:
      a first highly doped zone of the first conductivity type being disposed between said gate oxide region and a first LDD region, and a second highly doped zone of the first conductivity type being disposed between said gate oxide region and a second LDD region; and
      a third zone of the first conductivity type being disposed between said source zone and said substrate in a form of a well around said source zone, and a fourth zone of the first conductivity type being disposed between said drain zone and said substrate in a form of a well around said drain zone.

2. The MOS transistor according to claim 1, wherein a thickness of said first, second, third, and fourth zones is dependent on one of an energy of implanted doping atoms, a dosage of implanted doping atoms, and a type of the doping atoms.

3. The MOS transistor according to claim 1, wherein said first, second, third, and fourth zones have an n conductivity type as the first conductivity type.

4. The MOS transistor according to claim 1, wherein said first, second, third, and fourth zones have an p conductivity type as the first conductivity type.

5. In combination with a device having signal inputs and outputs, an ESD protective device connected to the signal inputs and outputs, comprising:
   an ESD protective element in the form of a MOS transistor integrated on a substrate, said MOS transistor including:
   a drain zone of a first conductivity type formed in said substrate;
   a source zone of the first conductivity type formed in said substrate, and a channel region formed between said drain zone and said source zone;
   a gate electrode and a gate oxide region disposed above said channel region;
   a first LDD region and a second LDD region;
   a first zone of the first conductivity type disposed between said gate oxide region and said first LDD region;
   a second zone of the first conductivity type disposed between said gate oxide region and said second LDD region; and
   a third zone of the first conductivity type disposed between said source zone and said substrate;

a fourth zone of the first conductivity type disposed between said drain zone and said substrate;

said gate electrode, said drain zone, said source zone, and said first, second, third and fourth zones together forming a transistor structure with a lateral breakdown voltage and a vertical breakdown voltage, said transistor structure having an adjustable voltage ratio between a value of the lateral breakdown voltage and a value of the vertical breakdown voltage, said first, second, third and fourth zones being formed to define the adjustable voltage ratio between the lateral breakdown voltage and the vertical breakdown voltage.

6. The ESD protective device according to claim 5 connected to an I/O pad of a CMOS circuit.

7. A MOS transistor, comprising:
a substrate;
a drain zone of a first conductivity type formed in said substrate;
a source zone of the first conductivity type formed in said substrate, and a channel region formed between said drain zone and said source zone;
a gate electrode and a gate oxide region disposed above said channel region;
a first LDD region and a second LDD region;
a first zone of the first conductivity type disposed between said gate oxide region and said first LDD region;
a second zone of the first conductivity type disposed between said gate oxide region and said second LDD region;
a third zone of the first conductivity type disposed between said source zone and said substrate;
a fourth zone of the first conductivity type disposed between said drain zone and said substrate; and
said gate electrode, said drain zone, said source zone, and said first, second, third and fourth zones together forming a transistor structure with a lateral breakdown voltage and a vertical breakdown voltage, said transistor structure having an adjustable voltage ratio between a value of the lateral breakdown voltage and a value of the vertical breakdown voltage, said first, second, third and fourth zones being formed to define the adjustable voltage ratio between the lateral breakdown voltage and the vertical breakdown voltage.

8. The MOS transistor according to claim 7, wherein a thickness of said first, second, third, and fourth zones is dependent on one of an energy of implanted doping atoms, a dosage of implanted doping atoms, and a type of the doping atoms.

9. The MOS transistor according to claim 7, wherein said first, second, third, and fourth zones have an n conductivity type as the first conductivity type.

10. The MOS transistor according to claim 7, wherein said first, second, third, and fourth zones have an p conductivity type as the first conductivity type.

* * * * *